United States Patent [19]

Breval et al.

[11] 4,054,801

[45] Oct. 18, 1977

[54] PHOTOELECTRIC COUPLER

[75] Inventors: Marcel Breval, Cagnes,Mer; Marc Prudhomme, Vence, both of France

[73] Assignee: Texas Instruments Incorporated, Dallas, Tex.

[21] Appl. No.: 580,251

[22] Filed: May 23, 1975

[30] Foreign Application Priority Data

May 24, 1974 France ................................ 74.18045

[51] Int. Cl.² .................................................. G02B 27/00
[52] U.S. Cl. ..................................... 250/551; 250/239
[58] Field of Search .............. 250/551, 552, 227, 239; 357/19

[56] References Cited

U.S. PATENT DOCUMENTS

| 3,192,387 | 6/1965 | Goodman | 250/551 |
| 3,370,174 | 2/1968 | Toussaint | 250/552 X |
| 3,628,039 | 12/1971 | Ochs et al. | 250/239 |
| 3,639,770 | 2/1972 | Zizelmann | 250/239 X |
| 3,660,669 | 5/1972 | Grenon | 250/551 |
| 3,818,451 | 6/1974 | Coleman | 250/551 X |

FOREIGN PATENT DOCUMENTS 2,106,710 5/1972 France ................................ 250/551

*Primary Examiner*—Eugene R. La Roche
*Attorney, Agent, or Firm*—Harold Levine; James Comfort; Richard Donaldson

[57] ABSTRACT

A photo-electric coupler, or isolator, wherein a semiconductor light emitter and a semiconductor photodetector are enclosed in a light transmissive body having a surface covering of light reflective material for reflecting toward the photodetector, incident light from the emitter. The emitter and detector can be disposed face-to-face or side-by-side. The reflective cover can provide an external protective covering for the device or a conventional housing can be used.

14 Claims, 7 Drawing Figures

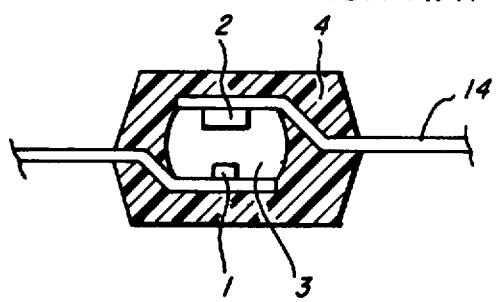
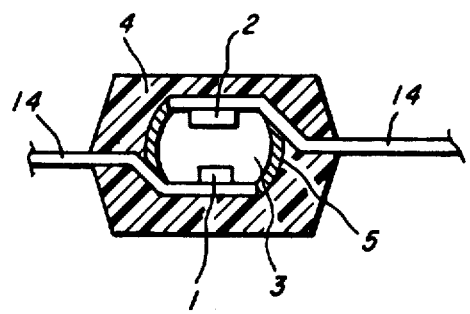
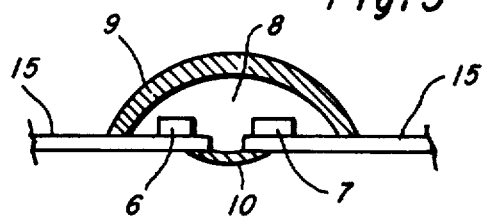
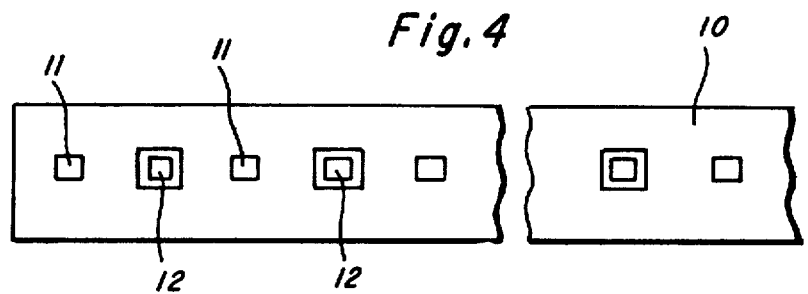
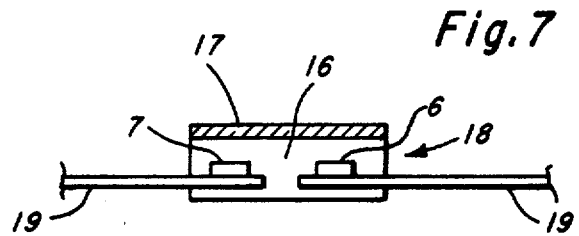

PHOTOELECTRIC COUPLER

The present invention relates to photoelectric couplers generally utilized as isolating components between electric circuits, and it relates more particularly to the improvement of the current transfer characteristics of these couplers.

A semiconductor photoelectric coupler is constituted by an electroluminescent semiconductor diode and a semiconductor photodetector mounted in a metal or plastic housing, and insulated from each other. If a current $I_1$ is applied to the electroluminescent diode, the latter emits a luminous radiation which excites the photodetector. The latter then delivers a current $I_2$ which depends on the intensity of the current applied to the electroluminescent diode. The ratio $I_2/I_1$ constitutes the transfer characteristic of the coupler.

This ratio, as well as the insulation between the electroluminescent diode and the photodetector, depends on the distance between these two elements.

In conventional photoelectric couplers, a transmission medium, constituted by a transparent resin, a glass plate or a gas contained in the housing of the coupler, is interposed between the electroluminescent diode and the photodetector. When the coupler is packaged in a housing of molded plastic, such as an epoxy resin or one containing silicones, the material of the housing absorbs a considerable part of the energy radiated by the electroluminescent diode. When the coupler is packed in a metal housing, the latter, owing to the fact that its inner wall is at a relatively long distance from the diode and the photodetector, reflects, toward the photodetector, only a small part of the light it receives from the electroluminescent diode. The result is that, in known photoelectric couplers, a non-negligible amount of the light emitted by the electroluminescent diode does not reach the photodetector, thereby resulting in a reduction in the $I_2/I_1$ ratio.

Accordingly, the invention provides a photoelectric coupler comprising a light emitter and a photodetector, a light transmissive medium being interposed between the said light emitter and the photodetector, wherein light reflective material overlies at least part of the surface area of the light transmissive medium to reflect, toward the photodetector, at least a portion of the light emitted by the light emitter which otherwise has a tendency to be dispersed in the light transmissive medium.

In one embodiment of the invention, the light emitter and photodetector are disposed with active surfaces thereof in face-to-face relation and the light reflective material surrounds the light emitter and photodetector, extending approximately parallel to the direction of light transmission.

In another embodiment, the light emitter and photodetector are disposed side-by-side with their active surfaces directed toward a surface of the light transmissive medium covered by light reflective material which surface may be shaped to enhance reflection of light from the emitter back toward the detector. Such an embodiment may be constructed in a particularly compact form, with a reduced height.

A coupler may be housed in a conventional package, plastic or metal can. However, for enhanced compactness and simplification of fabrication, the light reflective material itself may provide an external protective cover or housing for the coupler.

In order that the invention may be fully understood and readily put into effect, embodiments thereof will be described in greater detail with reference to the accompanying drawings, in which:

FIG. 1 is a schematic view in section of a conventional photoelectric coupler;

FIGS. 2 and 3 are schematic views in section of different embodiments of a photoelectric coupler according to the invention;

FIG. 4 shows an alternate hook-up of conventional couplers and couplers according to the invention;

FIG. 7 is a schematic section of a further embodiment of the invention.

Figure 5:
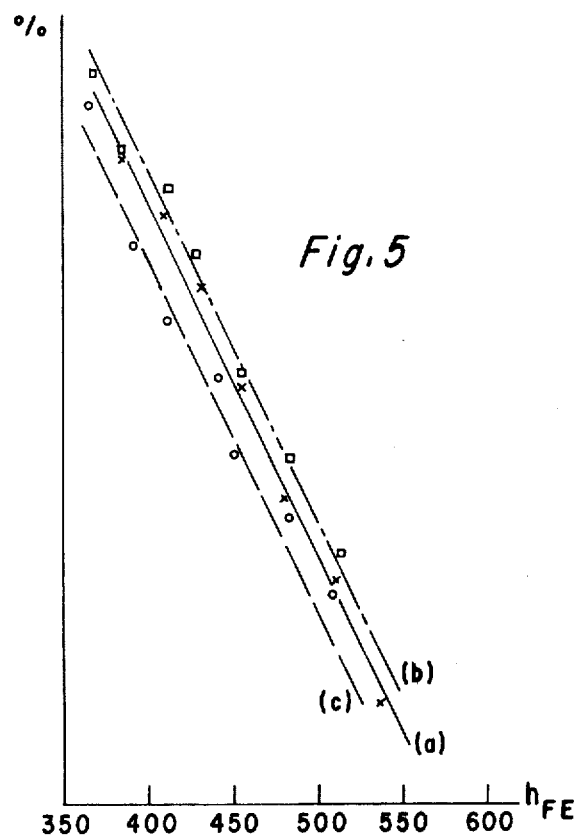
FIGS. 5 and 6 show curves relative to the comparative performances of conventional couplers and couplers according to the invention, related to FIG. 4.

The photoelectric coupler represented in FIG. 1 is a coupler of conventional type which comprises a light emitter 1, such as an electroluminescent semiconductor diode and a semiconductor photodetector 2 having an active surface disposed facing the active surface of the electroluminescent diode. The actual structures of the light emitter 1 and photodetector 2 are well known and need not be described herein. A light-transmissive medium 3, such as a resin, a glass plate or a gas is interposed between the electroluminescent diode 1 and photodetector 2, and the assembly thus constituted is enclosed in a housing 4 made of plastic material (or of metal) through which electrical leads 14 pass to the diode 1 and detector 2.

As indicated above, the current transfer characteristic of the coupler, given by the ratio between the current $I_1$ applied to the electroluminescent diode 1 and the current $I_2$ emitted by photodetector 2, is unfavorably affected by the absorption, e.g., by the housing 4, of a portion of the light emitted by diode 1.

A photoelectric coupler according to the invention is represented in FIG. 2 which permits a considerable improvement in this characteristic.

The coupler represented in FIG. 2 is generally analogous in construction to the coupler in FIG. 1, so that the same reference numbers are used for corresponding elements in these two couplers.

The difference between the conventional coupler and the one represented in FIG. 2, resides in the fact that between the light transmissive medium 3 (which conveniently may comprise Dow-Corning R6104 varnish) and the housing 4, a layer 5 of reflecting material is inserted, with the purpose of reflecting toward the photodetector 2 at least a portion of the light emitted by the electroluminescent diode which would otherwise have a tendency to be absorbed by the material of housing 4. This layer 3 surrounds the light transmission path between the diode and the photodetector. The reflecting material is likewise an electrical insulator and therefore insulates the light transmissive medium 3 with respect to the housing 4 of the coupler.

The material of the reflecting layer may be generally constituted by an insulating powder having a high coefficient of reflection by reason of its granulometry or its inherent characteristics. This powder preferably constitutes the load of a plastic material which acts as a binder. For example, the reflective coating may comprise Dow-Corning R6103 varnish loaded with 0.5 alumina.

Among powders which can be used, it has been found that powders of oxides such as $TiO_2$, MgO, BeO, or powders of chemical compounds of barium, such as barium sulphate or other salts of this metal are particularly suitable. The said oxides may alternatively be deposited by vaporization directly on the light transmissive medium 3.

It is also possible to utilize particles of polytetrafluoroethylene, or various other white resins having appropriate insulating and reflecting properties.

The photoelectric coupler represented in FIG. 3 is an alternative construction to that of the coupler in FIG. 2. It contains an electroluminescent diode 6 and a photodetector 7 spaced apart and disposed side by side. These two elements are enclosed in a light transmissive body 8 of dome-shaped form. The active surfaces of the diode 6 and photodetector 7 are directed toward the dome-shaped surface of the body 8. A cap 9 of reflecting material surrounds the upper dome-shaped surface of the light transmissive medium, while a cup 10 of smaller dimensions, also made of reflecting material, surround part of the light transmissive body between the diode 6 and detector 7 opposite cap 9. The whole is enclosed in a housing of plastic material (not represented), through which coplanar electrical leads 15 extend to the diode 6 and detector 7.

In view of the relative disposition of electroluminescent diode 6 and photodetector 7, it will be understood that the role of cap 9 is important, because a large portion of the light emitted by diode 6 is reflected by the cap toward the photodetector 7. Proper shaping and dimensioning of the cap increases the amount of incident light reflected to the detector 7.

A coupler of the type shown in FIG. 3, wherein the emitter and detector are coplanarly mounted, can be implemented directly (i.e., without use of an external housing) as a result of use of the reflecting surfaces of the caps 9 and 10. Such a coplanar arrangement is advantageous since, for example, it permits a height reduction in the overall package.

Comparative measurements of the efficiency of a conventional photoelectric coupler on the one hand, and couplers according to the invention on the other hand have been carried out. To do this, light emitters constituted by electroluminescent semiconductor diodes and light detectors constituted by phototransistors were used which originated respectively from a specific manufacturing batch.

The diodes and their associated phototransistors were mounted on a band 10 (FIG. 4) face-to-face or side-by-side, the distance between a diode and a transistor, designed to constitute a photoelectric couple, being constant as between each pair. A light transmissive resin was deposited between each diode-phototransistor pair. Alternate diode-phototransistor couples were enclosed in an electrically insulating resin, loaded with a finely divided alumina powder.

The configuration represented in FIG. 4 was thus obtained in which, on a single band 10, conventional photoelectric couplers 11 alternate with photoelectric couplers 12 according to the invention. The photoelectric couplers are thus fabricated and tested under the same conditions, so that the results which they yield can be compared. Tests were carried out in respect of electrical parameters of the test devices and the results are illustrated by FIGS. 5 and 6.

In FIG. 5, curve (a) represents the gain ($h_{FE}$) of the photodetector of a conventional coupler without reflecting surface, such as that in FIG. 1.

Curves (b) and (c) represent, respectively, the gain of photodetectors embodying the invention as represented in FIGS. 2 and 3.

Figure 6:
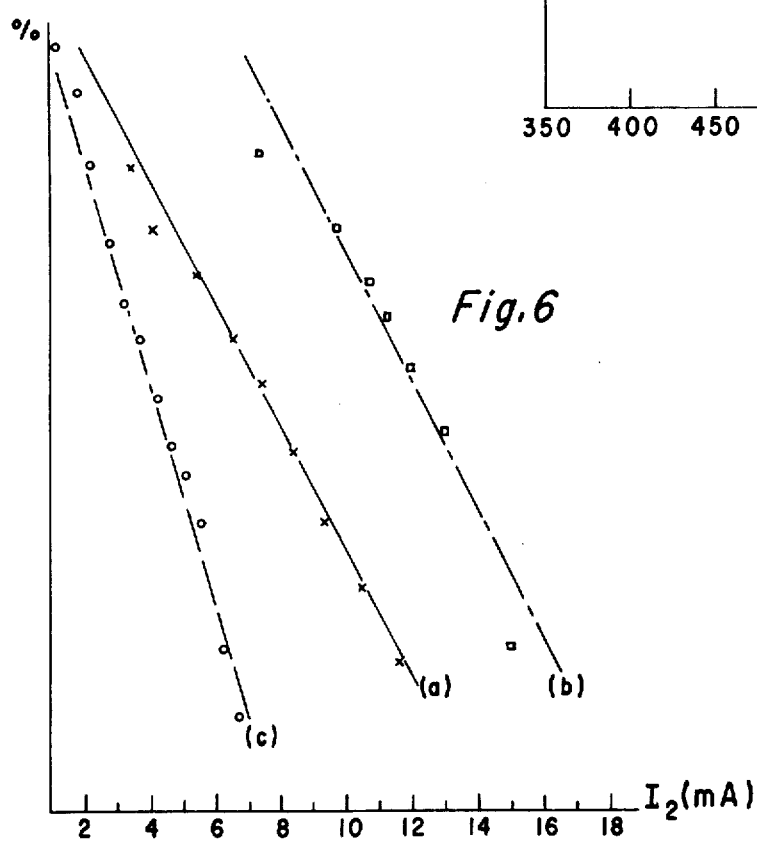

In FIG. 6, curve (a) represents the distribution of the value of the current from a photodetector of a conventional coupler such as that shown in FIG. 1.

Curve (b) represents the distribution of the corresponding current for a coupler with reflecting surface in accordance with the invention, such as that shown in FIG. 2.

Curve (c) represents the distribution of photodetector current from a coupler with reflecting layer in accordance with the invention, such as that shown in FIG. 3.

An improvement of about 60% in the current transfer of a coupler constructed according to FIG. 2 compared to that in FIG. 1 is noted.

As for a coupler constructed as shown in FIG. 3, whose electroluminescent diode and photodetector are mounted side-by-side, although the transfer characteristic is lower than that of a conventional photoelectric coupler as shown by FIG. 1, it still offers advantages in terms of ease of fabrication and compactness, particularly in package height reduction.

The photoelectric coupler as represented in FIG. 2 as well as that in FIG. 3, comprises a layer 5 (9) of reflecting material interposed between the light transmissive medium 3 (8) and the material of the housing. However, the reflective material itself may provide the housing within the concept of the present invention. For example, the emitter, detector and light transmissive medium could be transfer molded in a light reflective molding compound such as a molding compound combining a suitable powder as described above.

In a further embodiment, shown in FIG. 7, the luminescent diode 6 and photodetector 7 are mounted in side-by-side relation and surrounded by a rectangular section light transmissive body 16. The active surfaces of the diode 6 and detector 7 are directed to the upper flat surface of the body 16 which is coated with a layer 17 of light reflective paint. Preferably, the side walls 18 of the body 16 also are coated with light reflective paint. In this self-encapsulating structure, the electrical leads 19 to the diode 6 and detector 7 are coplanar with each other and with the bottom surface of the body 16. However, if preferred, the leads 19 could be displaced from the bottom surface of the body 16, e.g., in the manner shown in FIGS. 1 and 2.

In each of the above described embodiments of the invention, the light emitter may suitably be a semiconductor diode and the photodetector may suitably be a photodiode or a phototransistor. References to "opto-electric", "light transmissive" and "light reflective" comprehend both visible and non-visible portions of the spectrum.

Having described certain preferred embodiments of the invention, other embodiments within the scope of the appended claims will become apparent to a person skilled in the art.

What is claimed is:

1. An opto-electric coupler device comprising semiconductor light emitter means having an active surface, a semi-conductor photo detector means having an active surface disposed in spaced face-to-face relation with the active surface of said light emitter means, an electrically insulating light transmissive solid medium interposed between and imbedding the active surfaces of said light emitter means and said photo detector means, a light reflective surface layer on said light transmissive medium, surrounding said light emitter means and said photo detector means and providing a concave curved surface extending approximately in the direction of propagation of light from said light emitter means toward said photo detector means for reflecting internally of said light transmissive medium and toward said photo detector means light from said emitter means that is incident on said curved surface, and a protective housing surrounding said light transmissive medium, said reflective layer providing electrical insulation between said light transmissive medium and said housing.

2. A coupler device according to claim 1, wherein said reflective layer comprises a plastic material loaded with a powder selected from the group of oxides consisting of titanium oxide ($TiO_2$), magnesium oxide (MgO), beryllium oxide (BeO), and alumina ($Al_2O_3$).

3. A coupler device according to claim 1, wherein said reflecting means comprises a plastic material loaded with a powdered beryllium compound.

4. A coupler device according to claim 1, wherein said reflecting means comprises plastic material loaded with particles of resin.

5. A coupler device according to claim 1, wherein said reflective layer comprises an evaporated insulating oxide selected from the group comprising titanium oxide ($TiO_2$), magnesium oxide (MgO), beryllium oxide (BeO), and alumina ($Al_2O_3$).

6. A coupler device according to claim 1, wherein said housing for said device comprises a mass of plastic material.

7. A coupler device according to claim 1, wherein said reflective means comprises a resin.

8. A coupler device according to claim 7, wherein said resin is polytetrafluoroethylene.

9. An opto-electric coupler device comprising semiconductor light emitter means disposed in side-by-side relation with a semiconductor photo detector means, said light emitter means and said photo detector means electrically and physically mounted on electrical strip-leads and each having an active surface facing in a commmon direction, an electrically insulating light transmissive single composition solid body surrounding and imbedding said light emitter means and said photo detector means to provide an encapsulating package for and integral with said light emitter means and said photo director means, said strip leads extending externally of said solid body as a coplanar array and transversely of said side-by-side light emitter means and photo detector means, and a light reflective layer on a surface area of said light transmissive medium facing said active surfaces for reflecting internally of said light transmissive medium light from said light emitter means toward said photo detector means.

10. A coupler device according to claim 9, wherein said light transmissive medium comprises a resin body having a substantially flat surface facing said active surfaces of said light emitter means and said photodetector means, and wherein said light transmissive medium comprises a layer of light reflective material covering at least said substantially flat surface of said light transmissive medium.

11. A coupling device according to claim 10, wherein said light transmissive body has a substantially rectangular cross-section and the said light emitter means and said photo detector means are disposed adjacent a surface of said light transmissive body opposite said substantially flat surface thereof and wherein said leads provide a single co-planar array of electrical leads extend externally and laterally from said light transmissive body, and a protective housing for said device comprising said light transmissive medium and said light reflective layer thereon.

12. A coupler device according to claim 11, wherein said light reflective means comprises a layer of reflective paint on an outer surface area of said light transmissive medium.

13. A coupler device according to claim 9, wherein said light transmissive body has a dome-shaped surface, the active surfaces of said light emitter means and said photodetector means being directed toward said dome-shaped surface, and said light reflective means includes a light reflective layer covering said dome-shaped surface.

14. A coupler device according to claim 13, and further including a cup-shaped electrically insulating light reflecting layer disposed between said light emitting means and said photodetector means on a surface of said light transmissive body opposite said dome-shaped surface thereof.

* * * * *